United States Patent
Degani et al.

(10) Patent No.: US 6,251,705 B1
(45) Date of Patent: Jun. 26, 2001

(54) LOW PROFILE INTEGRATED CIRCUIT PACKAGES

(75) Inventors: Yinon Degani, Highland Park; Thomas Dixon Dudderar, Chatham; King Lien Tai, Berkeley Heights, all of NJ (US)

(73) Assignee: Agere Systems Inc., Berkeley Heights, NJ (US)

(*) Notice: Subject to any disclaimer, the term of this patent is extended or adjusted under 35 U.S.C. 154(b) by 0 days.

(21) Appl. No.: 09/425,706

(22) Filed: Oct. 22, 1999

(51) Int. Cl.[7] .................................................. H01L 21/48
(52) U.S. Cl. ............................................. 438/108; 438/106
(58) Field of Search .............................. 438/15, 106, 108, 438/719, 977, 51, 718

(56) References Cited

U.S. PATENT DOCUMENTS

| | | | |
|---|---|---|---|
| 5,516,728 | * 5/1996 | Degani et al. | 438/465 |
| 5,698,474 | * 12/1997 | Hurley | 438/15 |
| 5,952,247 | * 9/1999 | Livengood et al. | 438/734 |
| 5,963,781 | * 10/1999 | Winer | 438/14 |
| 6,122,174 | * 9/2000 | Livengood et al. | 361/736 |
| 6,127,274 | * 10/2000 | Igel et al. | 438/710 |

* cited by examiner

Primary Examiner—David Nelms
Assistant Examiner—David Nhu
(74) Attorney, Agent, or Firm—Thomas, Kayden, Horstemeyer & Risley LLP

(57) ABSTRACT

The specification describes methods for manufacturing thin tiles for IC packages using thinning techniques. The method includes the step of thinning the IC devices in chip form. This is achieved at the final stage of assembly where the chips are flip-chip bonded to the substrate and the backside of the chips is exposed for thinning. Using this approach, final chip thickness of the order of 2–8 mils can be produced and overall package thickness is dramatically reduced.

12 Claims, 2 Drawing Sheets

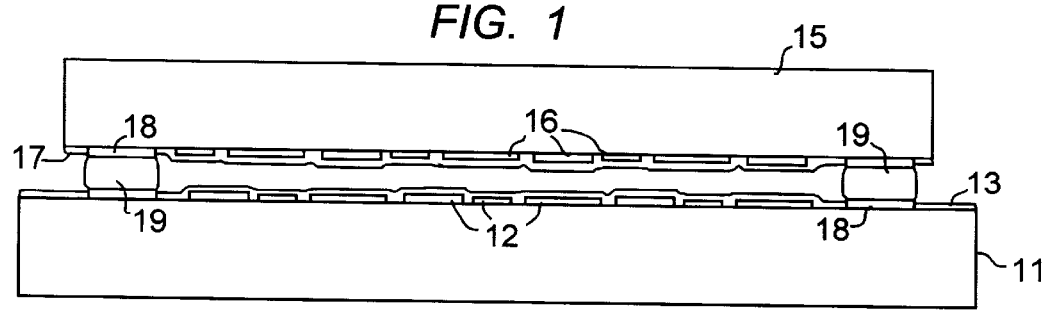
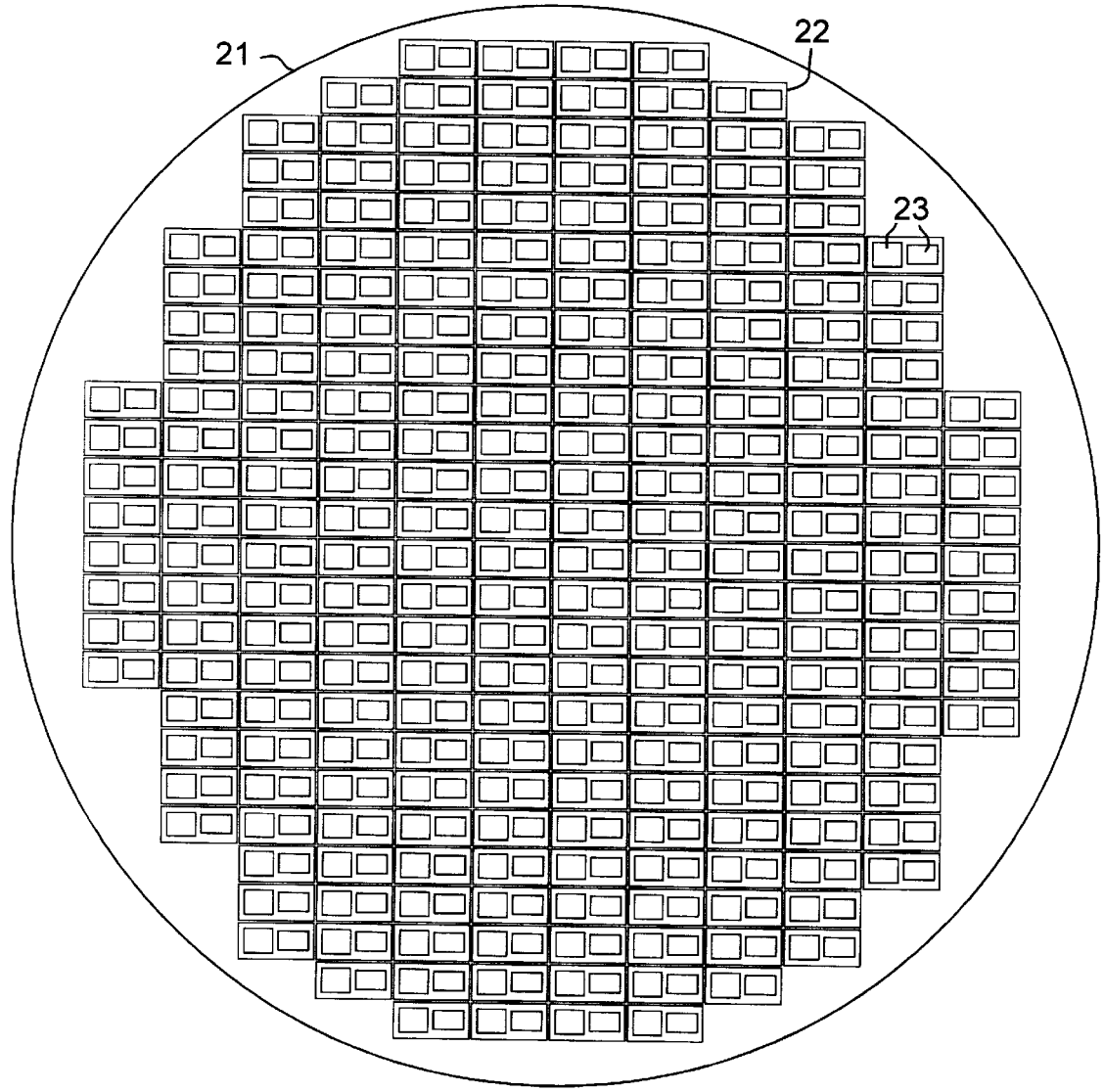

LOW PROFILE INTEGRATED CIRCUIT PACKAGES

FIELD OF THE INVENTION

This invention relates to integrated circuit packages with reduced height, and more particularly to flip-chip packages where the thickness of one or more IC components in the package is reduced by backside thinning.

BACKGROUND OF THE INVENTION

The microelectronics industry has thrived by consistently achieving ever shrinking size of devices and ever greater levels of device integration, resulting in higher interconnect densities. A steady succession of interconnect developments and strategies has evolved in the packaging industry to meet the demand of these high interconnect densities. Nearly all have been aimed at one goal-reduced size. With few exceptions, reduced size also translates into lower cost. Thus in state of the art packaging, dual-in-line packages have been largely replaced by surface mount packages, and newer developments, such as chip-on-chip (COC) and multichip modules (MCM), are meeting the high density interconnect demand. These and similar developments are directed toward reducing the package area, i.e. the x-y dimension of the package. The issue of package thickness has been addressed by techniques for thinning the wafers from which the chips are singulated. The thinning operation is performed on fully processed wafers by mounting the wafer, processed side down, on a temporary carrier such as an adhesive tape and grinding the backside of the wafer. A variety of grinding techniques have been proposed and used, ranging from simple mechanical abrasion using, e.g., an abrasive grinding wheel, to chemical etching and polishing techniques, and combinations of these, e.g. chemical mechanical polishing (CMP). In a typical wafer thinning process, a 200 mm diameter wafer of completed ICs may be reduced from an initial thickness of 26 to 30 mils to a final thickness of only 12 mils before it is remounted and diced. The individual IC chips, or die, are then packaged, which may involve assembly into an MCM or COC tile. The term tile as used herein refers to a sub-assembly of at least two components, a substrate and at least one active chip flip-chip bonded to the substrate. The substrate of the tile may or may not be an active chip. In a common arrangement, the tile comprises two or more components, a substrate, and one or more chips either alone, side-by-side, or chip-on-chip, carried by the substrate. Again, the substrate may be active or passive. The chip-on-chip may comprise two stacked chips, or two or more chips stacked on one, usually larger, chip. The term substrate refers in this context to a support element, either active or passive, and the term chip typically refers to a fully processed, i.e. finished, semiconductor IC device. In the preferred case, all of the elements in the tile are semiconductor, typically silicon. The substrate may also be ceramic.

In the assembly operation, the singulated die are handled through a die mounting and bonding tool, and additional interconnections made as needed. To withstand this additional processing without fracture, a die thickness of 10 mils or greater is generally adequate. However, a die thickness of less than 8 mils, which would otherwise be desirable for many applications, is prohibited by the exposure to handling after thinning.

The limitation on thickness of the die applies also to a support wafer or substrate. This limitation, 10 mils or greater, is generally accepted in the industry as a norm, and tiles of less than 20 mils have not been attainable. This constraint rules out the use of stacked chips or tiles in several important applications, such as so-called smart cards, i.e. credit cards with imbedded chips.

A technique for reducing the height of IC package tiles would be a substantial advance in the chip packaging technology.

STATEMENT OF THE INVENTION

We have developed a manufacturing process for producing IC package tiles with dramatically reduced thickness. The key element in this process is the application of the thinning step to a finished IC chip already flip-chip bonded to the substrate wafer. Since no additional handling of unmounted chips is necessary, the chips can be thinned to well below 10 mils, e.g. 2–8 mils. Reduction of the thickness of the mounted chip can reduce the overall height of the package in some cases by half, thus producing twice the device functionality for a given package area and height.

BRIEF DESCRIPTION OF THE DRAWING

FIG. 1 is a schematic view of a typical IC package tile;

FIG. 2 is a view of a wafer layout showing three element tiles mounted for the chip thinning operation according to the invention;

DETAILED DESCRIPTION

Figure 3:
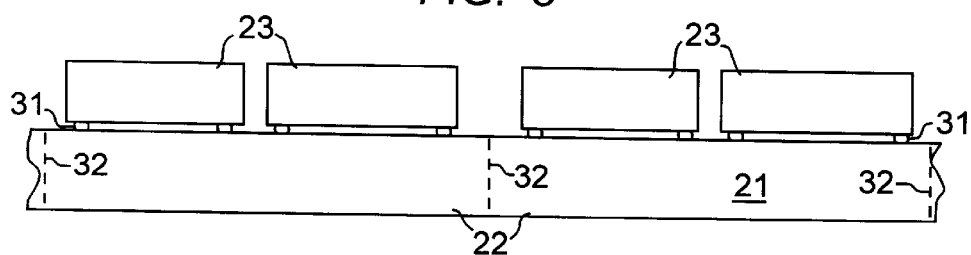
FIG. 3 is an elevation view of a portion of the wafer of FIG. 2.

With reference to FIG. 1, silicon substrate 11 is shown with devices 12 on the surface thereof. The devices may be active semiconductor devices, such as transistors, or may be resistors or capacitors, or may be a mixture of these. If the devices include active semiconductor devices a passivating coating 13, such as polyimide, covers the devices. A silicon chip 15 is flip-chip bonded to substrate 11 as shown. The silicon chip 15 also has devices 16 on the chip and polyimide coating 17. The silicon chip 15 is attached to the substrate 11 using under bump metallization (UBM) 18 and solder bump bonds 19.

The usual thickness of a semiconductor wafer from a wafer manufacturer is 25–35 mils. In state of the art packaging, the wafer may be thinned to 12–20 mils to reduce the package size. After thinning, the wafer is diced into individual die and the die are bonded to a substrate for final assembly. Accordingly, with reference to FIG. 1, a typical tile with substrate 11 and chip 15 will have a combined z-dimension (height) of two times 12–20 mils, plus the standoff which is typically 2–5 mils. Thus in the technology described here the overall tile height would be in the range 26–45 mils.

Devices like the one shown in FIG. 1 are manufactured by bump bonding singulated chips to a silicon substrate wafer. A typical wafer is shown in FIG. 2. The silicon wafer 21 has a large number of chip bonding sites 22, each of which will become, after dicing, a substrate such as 11 in FIG. 1. Silicon chips 23 are flip-chip bonded to the chip bonding sites on the substrate wafer. FIG. 2 shows two chips attached to each site. The number may be larger, or, as in FIG. 1, a single chip may be used per site. In some cases, some of the sites may be defective and therefore left vacant. As indicated earlier, the substrate wafer may be a bare silicon wafer, or may contain passive or active devices as shown in FIG. 1.

Figure 4:
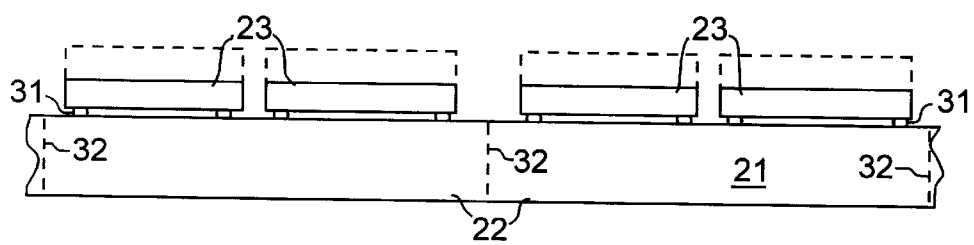
FIG. 4 is a view of the portion of the wafer of FIG. 3 after the chip thinning step.

An elevation view of a portion of the wafer of FIG. 2 is shown in FIG. 3. The cutaway portion of wafer 21 is shown with two chip bonding sites 22. The chips are shown at 23, bump bonded to the substrate using solder bumps 31. The dicing saw streets are shown at 32. The chips 23 may have the thickness of the original wafer. Alternatively, the chips may be thinned at the wafer level, i.e. by thinning the fully processed wafer, to reduce the chip thickness to 12–20 mils. The substrate wafer may already be thinned to a comparable thickness at this stage of the process. After the chip mounting and solder reflow operation, but before dicing the wafer, the front side of the wafer, on which the backsides of the chips are exposed, is thinned. This step is represented by FIG. 4, where the height of the chips is shown substantially reduced. Using the approach of the invention, the chips can be thinned to below 10 mils, e.g. 2–8 mils. This reduces the overall package height, in the case described, by 4–18 mils, or a 10–40% reduction from the optimally thin package of the prior art.

The use of a protective filler prior to the thinning operation may be desirable, and in some cases preferred. This is due to the dual function of an appropriate filler material to provide protection against abrading and dicing debris, and also to impart physical strength to the assembly during the mechanical thinning and dicing operations. Appropriate filler materials are described and claimed in U.S. Pat. No. 5,516,728, issued May 14, 1996 to Degani et al., which patent is incorporated herein by reference for these teachings. In general, the filler materials are essentially water insoluble materials that can be solvent removed by polar organic solvents such as methanol, ethanol, or propanol. Preferred filler materials are rosins, or contain rosins. Rosin materials typically contain one or more resin acid(s) or derivatizied resin acid(s) such as benzoic anhydride, 2-hexadecanone, and 2,2'-biphenol. The rosin material may be applied as a coating over the wafer and melted at a temperature of e.g. >120° C. to fill the void spaces.

Figure 5:
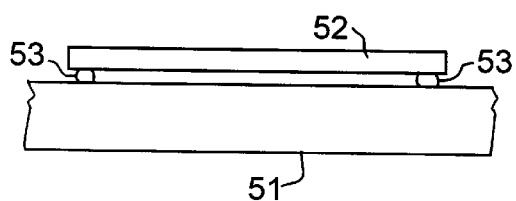
FIGS. 5 and 6 illustrate two embodiments of IC package tiles that can be processed according to the invention.
Figure 6:
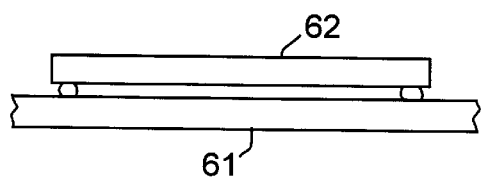

FIGS. 5 and 6 present schematic representations of alternative tile arrangements that may be used to advantage with the invention. FIG. 5 represents the embodiment where a single level of chips are flip-chip bonded to the wafer. The wafer 51 may be passive, i.e. bare of devices, or may contain active semiconductor devices, and/or devices such as resistors, capacitors, etc. The substrate 51 may be bare ceramic, or may be ceramic with resistors, capacitors, etc. The single level of chips represented by chip 52 is flip-chip mounted directly to substrate 51 using solder bumps 53.

With reference to FIG. 6, a tile is shown that has been twice thinned according to the invention, thereby allowing a drastic reduction in overall tile thickness. Substrate 61 supports IC chip 62, which is thinned by the technique described above. After the chips are thinned, the assembly is remounted on the carrier tape with the chip side of the wafer on the tape and the backside of the substrate 61 is thinned. An additional step of partially singulating the substrate wafer by scribing or sawing the active side of the substrate wafer to a depth approximately equal to the final wafer thickness may be desirable. In this way the tiles can be thinned and singulated in the same operation. Thus this ultra-thin tile is produced using two iterations of the process represented by FIGS. 2 and 3. This package can be produced, using the process of the invention, with a height well below 20 mils, even below 10 mils. If the components are thinned to 2 mils, with a 2 mil standoff between them, the overall tile thickness is 6 mils. Such small profile tiles are suitable for incorporation in credit cards, or for other applications demanding slim profiles.

The thinning step of the invention may be performed by any of several known techniques, such as mechanical grinding or laser ablation. Apparatus for silicon wafer thinning is widely used and commercially available. For example, a suitable laminator/delaminator for mounting wafers is the NEL system available from Nitto Denso. Grinder model GNX-200 Grind-X available from Okamoto can be used for the thinning operations described here.

It will be recognized that an advantage of the invention is that the wafers of active chips can be fully processed without any thinning at all. This retains the wafer in a robust state during handling and reduces the likelihood of fracture. Alternatively, two thinning steps may be used, one at the wafer level before chip mounting, and a final thinning of the mounted chips. In the first thinning step, the wafer is thinned from the production thickness of 25–35 mils by, for example, 25–67%. This leaves the wafer and the chips singulated from the wafer with a thickness adequate for handling. The wafer is singulated into chips, and the chips are flip-chip mounted on the wafer substrate. The second thinning step is then performed in which the thickness of the chips is reduced further by at least 25%.

The solder bump arrangement shown in the figures has an array of bonding sites around the perimeter or edge of the chip. Other arrangements are equally adapted to the invention. For example, state of the art chips commonly are interconnected using area arrays, defined as having interconnection sites in the area of the chip removed from the edge, e.g. at least one pitch length interior of any edge interconnection site. This invention is applicable to chips of any configuration which can be flip-chip bonded.

The chips in the assembly of the invention are completely processed chips that are flip-chip mounted so that the backside of the chip is presented at the final stage of processing for the essential thinning operation. The essence of flip-chip mounting is the attachment of completely processed semiconductor IC substrates "upside down" on the interconnection substrate, i.e. a silicon wafer or ceramic substrate. The attachment means is typically solder, in the form of balls, pads, or bumps (generically referred to herein as bumps). Solder bumps may be applied to the semiconductor chip, or to the interconnection substrate, or to both. In the bonding operation, the chip is placed in contact with the substrate and the solder is heated to reflow the solder and attach the chip to the substrate. For successful bonding, it is necessary that the sites to which the solder is bonded it wettable by the solder.

The metal interconnection pattern typically used for integrated circuits and flip-chip substrates is aluminum. While techniques for soldering directly to aluminum have been tried it is well known and accepted that aluminum is not a desirable material to solder. Consequently the practice in the industry is to apply a solderable metal coating on the aluminum contact pads, and apply the solder bump or pad to the coating. The metal coating is typically referred to as Under Bump Metallization (UBM).

The metal or metals used in UBM technology must adhere well to aluminum, be wettable by typical tin solder formulations, and be highly conductive. A metallization meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or co-deposited layer of chromium and copper is typically used between the chromium and copper layers.

As used herein, the term bonding site is intended to refer to sites where IC chips are ball or bump bonded to the substrate. The bonding sites generally are provided with under bump metallization. These sites are prepared on both the substrate wafer and the chips that are mounted on the substrate wafer.

The IC package tile described here is typically assembled on a printed wiring board, usually with several other tiles and other components. The term printed wiring board refers to standard epoxy boards, for example FR4, ball grid array interconnect substrates, and any other suitable interconnect substrate. The tile may be solder bump or ball bonded, or wire bonded, to the board, or alternatively to an intermediate silicon interconnect substrate.

The material of the chips and the preferred material for the substrate according to the invention is semiconductor. Most typically this will be silicon. An advantage of using silicon substrates for supporting silicon chips is that the thermo-mechanical properties of the substrate and chip match. Another advantage is that the metallization technology for forming fine patterns of runners on the substrate is well known and is used in making the IC chip itself. However, the invention is also applicable to other semiconductor materials, notably III-V semiconductor materials such as GaAs and InP used in lightwave devices.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for manufacturing IC device packages comprising:
   a. forming IC device tiles by the steps of:
      i. providing a plurality of chip bonding sites on a substrate;
      ii flip-chip bonding at least one semiconductor integrated circuit chip to each of said chip bonding sites, said semiconductor integrated circuit chips having a top side and a bottom side, with completed integrated circuits on the bottom side;
      iii thinning the top side of the said at least one integrated circuit semiconductor chip on each of said chip bonding sites;
      iv. dicing said substrate to produce a plurality of thinned IC device tiles; and
   b. mounting the thinned IC device tiles in IC device packages.

2. The method of claim 1 wherein the said substrate is silicon.

3. The method of claim 2 wherein the semiconductor integrated circuit chips comprises silicon.

4. The method of claim 1 wherein the semiconductor integrated circuit chip is mounted by the step of solder bump bonding the semiconductor chip to the substrate.

5. The method of claim 2 wherein passive devices are supported by the substrate.

6. The method of claim 3 wherein the substrate contains IC devices.

7. The method of claim 5 including the additional step of applying a filler over the substrate prior to step iii.

8. A method for manufacturing IC device packages comprising:
   a. forming IC device tiles by the steps of:
      i. thinning a fully processed semiconductor wafer;
      ii. dicing said fully processed semiconductor wafer to produce integrated circuit chips;
      iii. providing a plurality of chip bonding sites on a semiconductor substrate;
      iv. flip-chip bonding at least one of said integrated circuit chips to each of said chip bonding sites, said at least one semiconductor integrated circuit chip having a top side and a bottom side, with completed integrated circuits on the bottom side;
      v. thinning the top side of said at least one integrated circuit chip to a thickness of less than 10 mils;
      vi. dicing said semiconductor substrate to produce a plurality of tiles, and;
   b. mounting the thinned IC device tiles in IC device packages.

9. The method of claim 8 wherein both the fully processed semiconductor wafer and the semiconductor substrate are silicon.

10. The method of claim 9 including the additional step of thinning the semiconductor substrate.

11. The method of claim 8 including the additional step of applying a filler over the semiconductor substrate prior to step v.

12. The method of claim 11 wherein at least two silicon chips are bonded to each chip bonding site.

* * * * *